United States Patent [19]

Son et al.

[11] Patent Number: 5,579,280
[45] Date of Patent: Nov. 26, 1996

[54] SEMICONDUCTOR MEMORY DEVICE AND METHOD FOR GATING THE COLUMNS THEREOF

[75] Inventors: Moon-Hoi Son, Seoul; Churoo Park, Suwon-city; Seong-Ook Jung, Seoul, all of Rep. of Korea

[73] Assignee: Samsung Electronics Co., Ltd., Suwon-city, Rep. of Korea

[21] Appl. No.: 458,765

[22] Filed: Jun. 2, 1995

[30] Foreign Application Priority Data

Jun. 4, 1994 [KR] Rep. of Korea ............... 12655/1994

[51] Int. Cl.$^6$ ........................................... G11C 8/00
[52] U.S. Cl. .................. 365/238.5; 365/230.03; 365/230.06
[58] Field of Search .................... 365/230.02, 230.03, 365/230.06, 238.5

[56] References Cited

U.S. PATENT DOCUMENTS 5,262,990  11/1993  Mills et al. .................. 365/189.02

Primary Examiner—David C. Nelms
Assistant Examiner—Trong Phan
Attorney, Agent, or Firm—Cushman, Darby & Cushman, L.L.P.

[57] ABSTRACT

Disclosed is a semiconductor memory device with a block write function for reading and writing data in a unit of two bytes, which comprises a plurality of memory cell blocks for associating bits accessed in response to a column address to designate the upper one of the two bytes and bits accessed in response to a column address to designate the lower one of the two bytes, at least two column select lines enabled in response to same column addresses, and a control circuit for separately controlling the two column select lines, wherein the bits of the upper and lower bytes stored in the memory cell blocks are all outputted in response to the column addresses.

11 Claims, 7 Drawing Sheets

SEMICONDUCTOR MEMORY DEVICE AND METHOD FOR GATING THE COLUMNS THEREOF

TECHNICAL BACKGROUND

The present invention relates to a semiconductor memory device, and more particularly to a semiconductor memory device with a block write function and a method for gating the columns thereof.

Advancement of technology for designing and fabricating a semiconductor memory device has made it possible to produce a highly integrated semiconductor memory device. In addition, it tends to be byte-wide having multifunctions so as to be used in a technical field such as graphic representation. Generally, a memory cell array consists of a plurality of memory cell blocks, which have a plurality of input/output line pairs. The reading or writing data from or into a memory cell is accomplished through the input/output line pair selected according to the address corresponding to the memory cell. For example, a semiconductor memory device of special use such as Video Random Access memory (Video RAM) performs block write function to write data into each of the memory cell blocks as a unit. Block write function requires column masking for masking the data of a specified memory cell.

FIG. 1 illustrates the conventional decoding structure of a conventional memory cell array of graphic use for performing the block write function to mask selected columns of a byte as a unit. It is assumed that one byte consists of eight bits and a data width is sixteen bits. In FIG. 1, a single memory cell block 2 is defined to have 256K bits ($K=2^{10}$) and all the blocks include 2M bits ($M=2^{20}$). Reference numerals 4A and 4B indicate the column decoders for decoding the data stored in the memory cell blocks. The column decoders 4A and 4B are to respectively decode the upper four and the lower four byte blocks. The decoding is accomplished in the so called half-activation to activate the odd or even numbered blocks 2. The adjacent blocks 2 commonly occupy a pair of input/output lines IO. However, the adjacent blocks in the boundary between the upper and the lower byte blocks include two or four pairs of input/output lines as shown in FIGS. 2A and 2B.

Meanwhile, the column decoders 4A and 4B shown in FIG. 3 are pre-decoders, one example of which is disclosed in Korean Patent Application No. 94-4126 filed in the name of the present applicant on Mar. 3, 1994. Referring to FIGS. 1 and 3, as is well known in the block write, the data Din inputted via a data input buffer (not shown) is a masking data for determining whether to enable or disable column selection lines CSL to control the column gates.

Referring to FIG. 3, if the block write signal øBW a logic high, although the signals CA0, CA1, CA2 may be employed to make one of the eight combination signals DCA012 a high logic (which may be represented by the signal CSL or DQ as described in the above Patent Application), but the DCA012 is determined to have the high or low signal in logic according data input signal Din($\overline{Di}$ (i=0, 1, ... 7) shown in FIG. 3), so as to cause the column decoder to enable CSL thus simultaneously working a maximum eight memory cell blocks. Before performing the write command, the data is stored into the register of the memory device in advance, which register is called the color register in a semiconductor memory device used for graphics. For example, the inputted data Din is stored into the color register at LCR (load color register) timing or special WCBR timing in the respective case of a video RAM or a synchronous graphic dynamic RAM). Referring to FIG. 1 for illustrating the memory cell blocks with the data width of ×16 indicating two bytes (one byte equals eight bits), the column masking is performed by two column decoder blocks each for controlling one of the two bytes (DQ0, ... , 7, DQ8, ... , 15). The column decoder includes DCA012 as shown in FIG. 3, and decoding blocks for decoding the addresses over CA3. The page depth is 256(2') from CA0 to CA7. The adjacent memory cell blocks commonly occupy a pair of data input/output lines IO and respectively output two DQs of the four DQs per one block of 256K.

The upper byte blocks (DQ8, ... , 15) and the lower byte blocks (DQ0, ... , 7) each are independently controlled by a respective column decoder requiring ten pairs of the data input/output lines IO. Meanwhile, four pairs of data input/output lines are required between the upper blocks and the lower blocks. In each of the upper and lower blocks, while the isolation gate may be used so that the activated 256K block and the inactivated 256 block commonly occupy the data input/output lines, as shown in FIG. 2A, it is impossible to commonly occupy the data input/output lines between the upper byte blocks and the lower byte blocks, as shown in FIG. 2B. If the data input/output lines are commonly occupied, as shown FIG. 2C, the number of the CSL lines connected with the data input/output lines is increased double, which results in a doubled junction loading.

SUMMARY OF THE INVENTION

It is an object of the present invention to provide a semiconductor memory device and method for gating the columns thereof, which secures an effective lay-out.

It is another object of the present invention to provide a semiconductor memory device and method for gating the columns thereof, which obviates the doubled junction loading of the data input/output lines.

It is still another object of the present invention to provide a semiconductor memory device and method for gating the columns thereof, which secures the number of the data input/output lines minimized.

It is a further object of the present invention to provide a semiconductor memory device and method for gating the columns thereof, wherein the column masking may be performed per byte.

According to the present invention, a semiconductor memory device comprises a plurality of memory cell blocks each commonly occupied by the bits of the upper and lower bytes, at least two column select lines enabled by a single column address, and a control circuit for controlling the two column select lines separately with each other, wherein the bits of the upper and lower bytes are simultaneously gated according to the input of an address signal.

The present invention will now be described with reference to the drawings attached only by way of example.

BRIEF DESCRIPTION OF THE ATTACHED DRAWINGS

Figure 4:
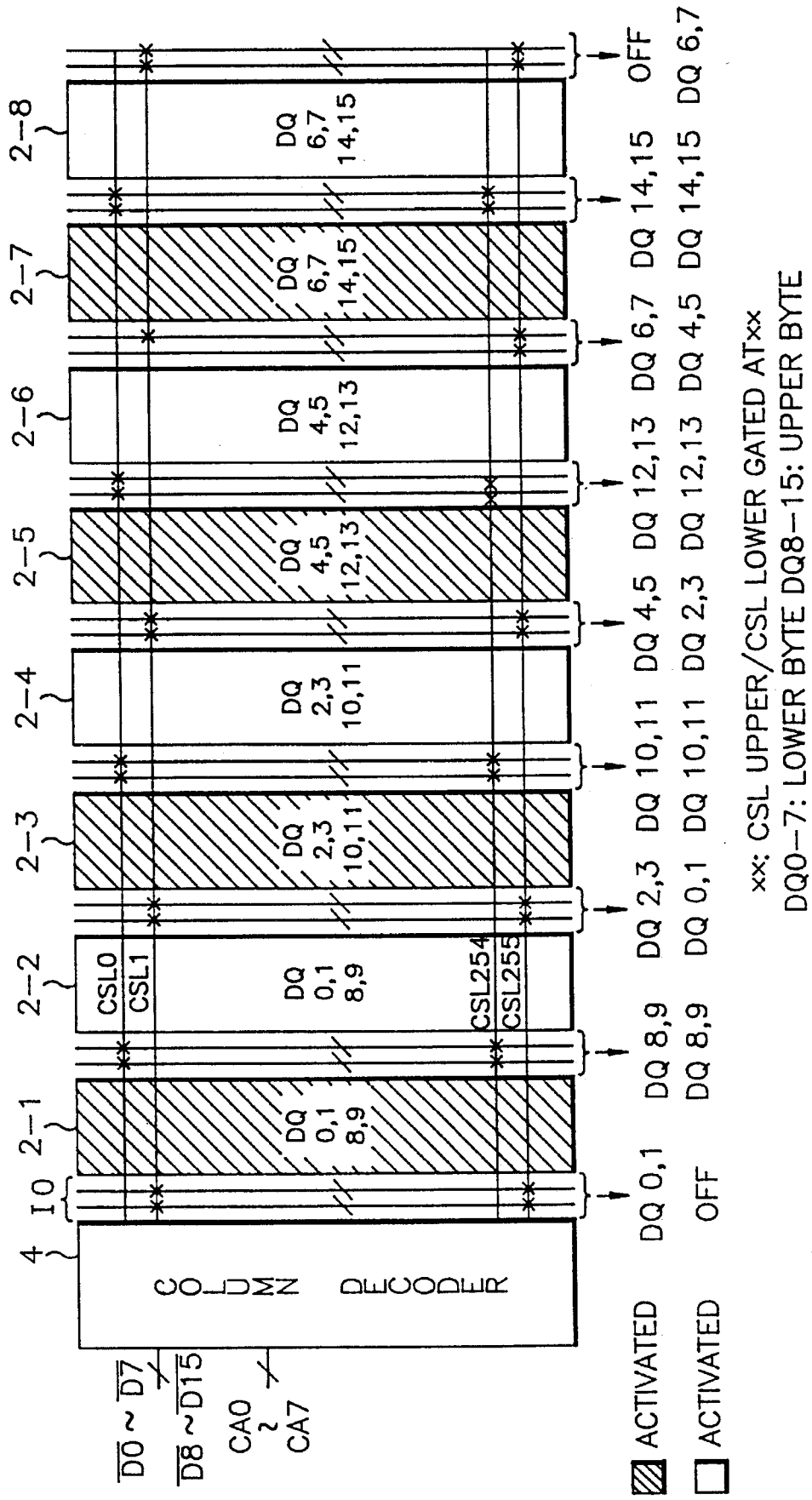
FIG. 4 is a schematic diagram for illustrating the structure of the memory cell blocks together with the column decoder according to the inventive column gating.
Figure 5:
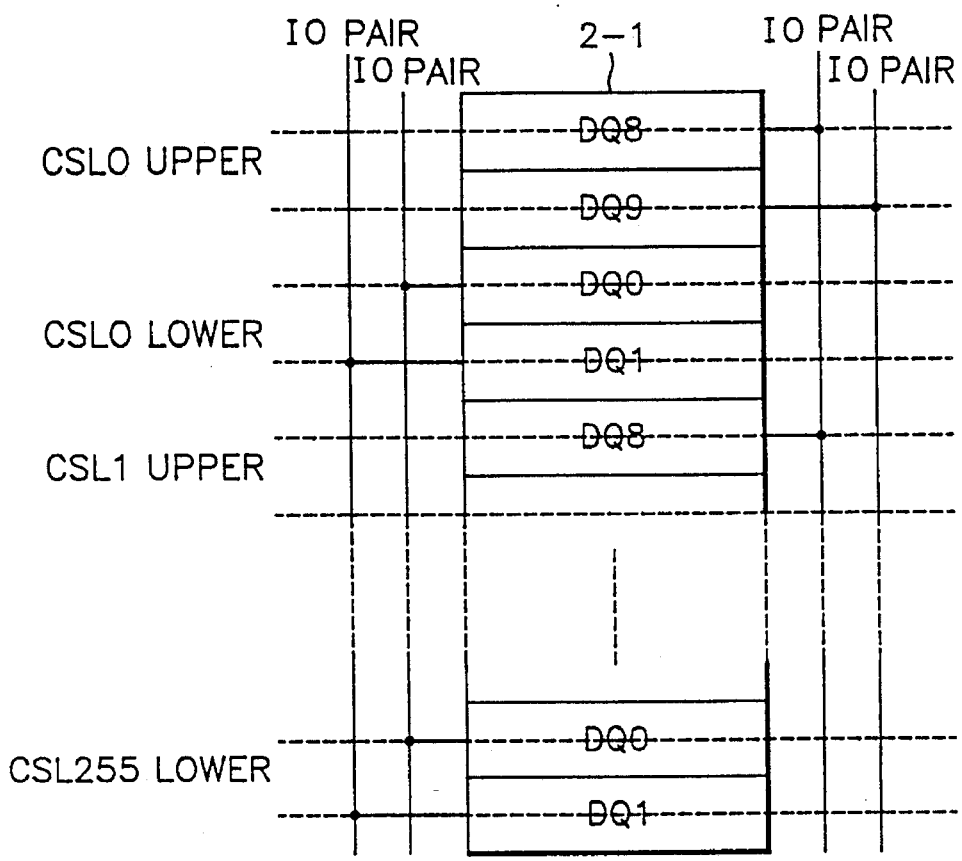
Figure 7:
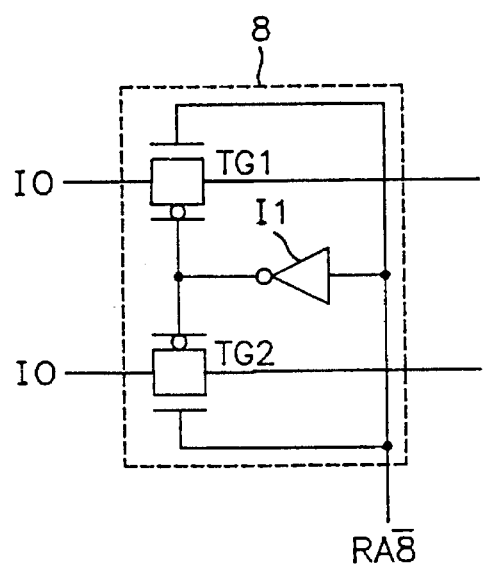
Figure 6:
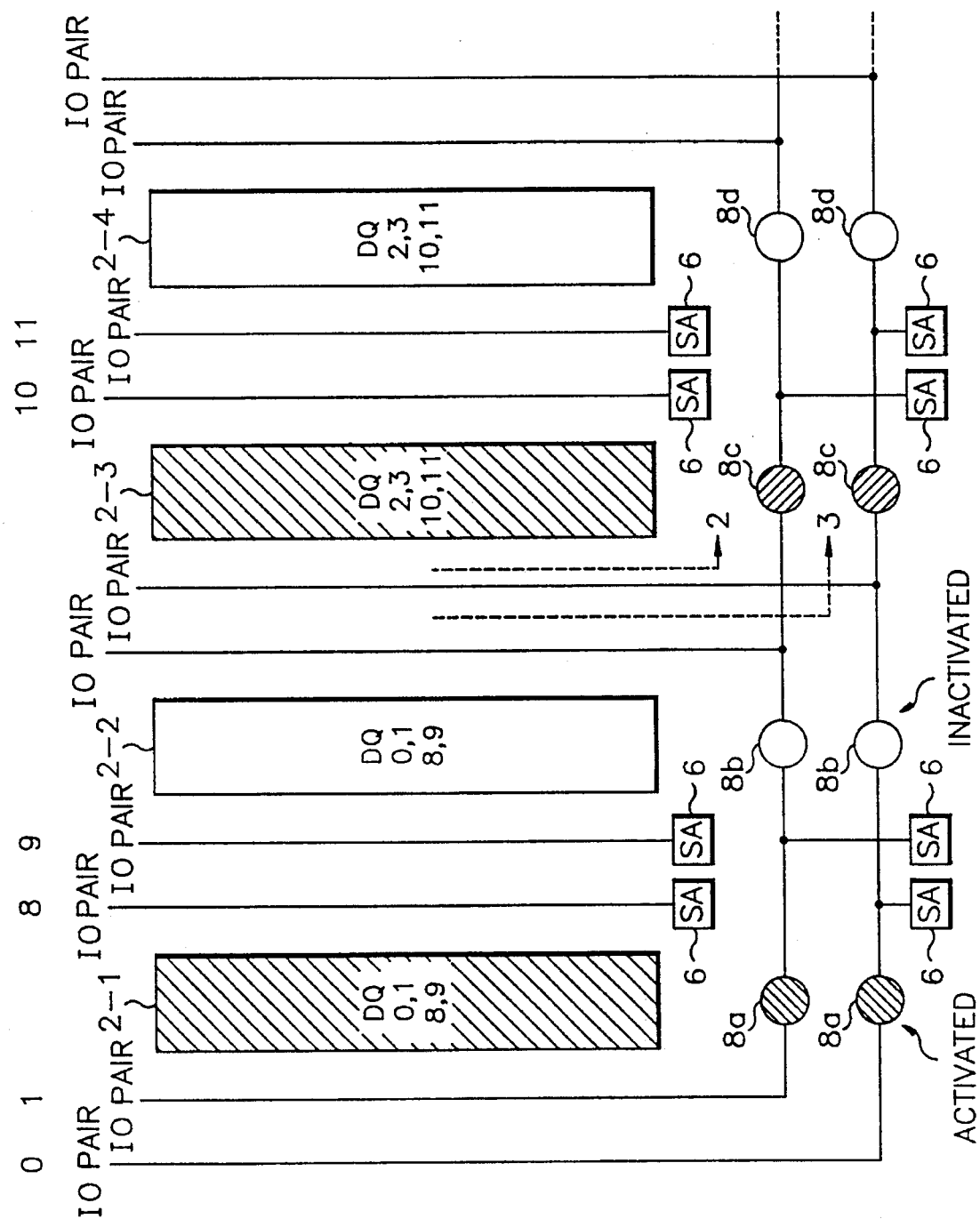
Figure 8:
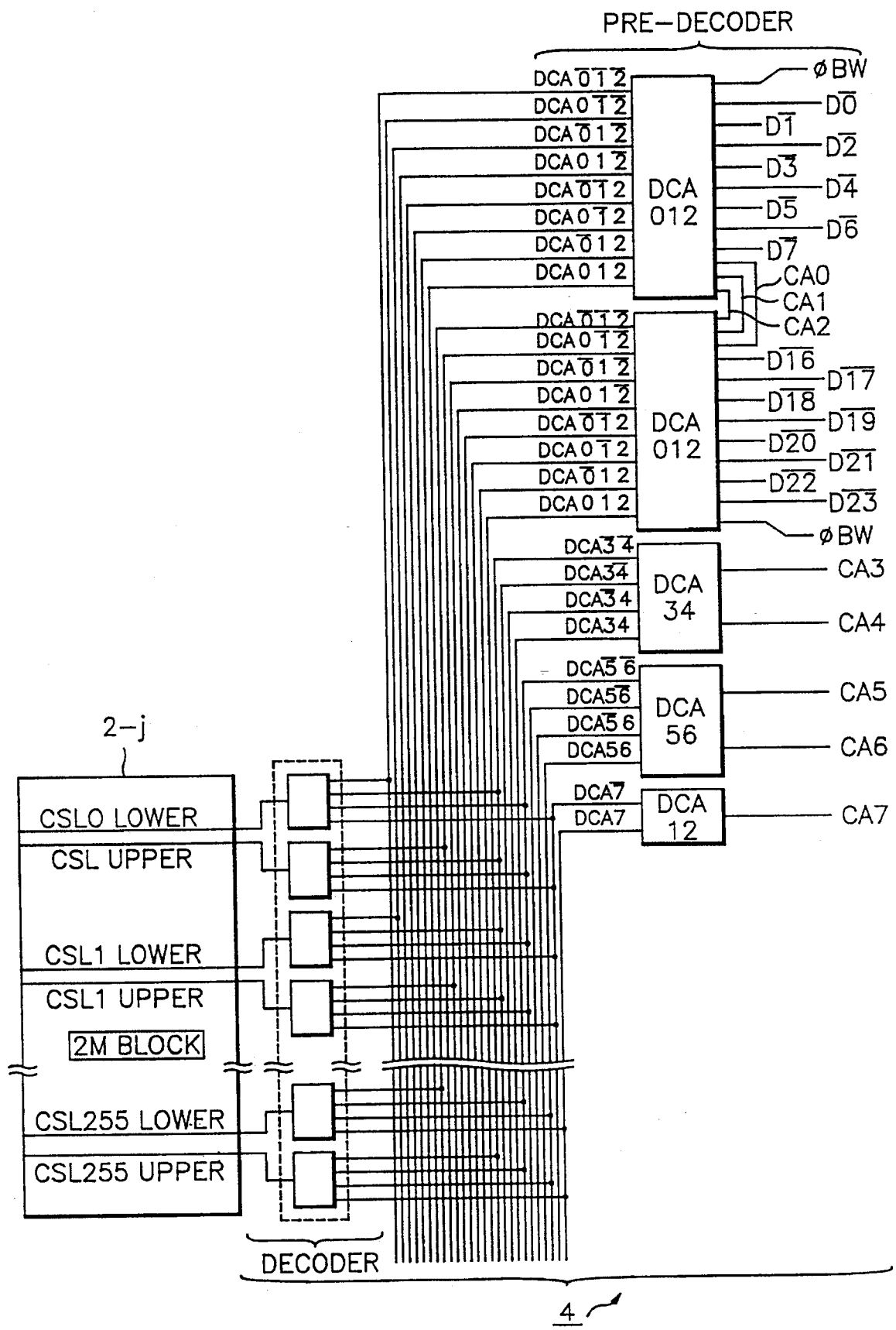

FIG. 5 schematically illustrates the internal bit arrangement of each memory cell block of FIG. 4 according to an embodiment of the present invention;

FIG. 6 shows the path for outputting the bits of each memory cell block in response to the half-activation of FIG. 4;

FIG. 7 is a schematic diagram for illustrating the multiplexer (8) as shown in FIG. 6; and FIG. 8 is a schematic block diagram for illustrating the column decoder as shown in FIG. 4.

DETAILED DESCRIPTION OF PREFERRED EMBODIMENTS

The word 'column gating' used in the application means that each of the memory cell blocks is accessed to store or output according to an address data by gating the columns of the memory device. The data or bits are stored into the memory cells as cell data.

Referring to FIG. 4, a byte-wide memory device includes 2M of eight memory cell blocks 2-j (j=1, 2, ..., 8) each having two byte(=16 bits represent a unit pixel) of ×16 data width. Each block is 256K. These 2M blocks are arrayed in rows and columns. Each of the eight memory cell blocks 2-j is provided with two pairs of data input/output lines IO respectively arranged in the left and right sides. These eight memory cell blocks 2-j are selected by a single column decoder 4. Each of the memory cell blocks is commonly occupied by the bits of the tipper and lower bytes. For example, the memory cell block 2-1 includes the bits DQ0, DQ1 of the lower byte and the bits DQ8, DQ9 of the upper byte. The memory cell block 2-2 positioned second from the left has the same data structure as the memory cell block 2-1, but reversely activated. Likewise, the memory cell blocks 2-3 and 2-4 have the same data structure with the bits DQ2, DQ3 of the lower byte and the bits DQ10, DQ11 of the upper byte, but reversely activated. In this manner, the remaining memory cell blocks 2-5, 2-6, 2-7, 2-8 are paired to have the same data structure but to be reversely activated. Such construction of the memory cell blocks is called interleaved activation or half-activation. The inventive column gating is performed by the column select lines CSLi (i=0, 1, 2, ..., 255) for accessing the memory cell blocks 2-j. Of course, an input/output pad (not shown) is connected with the column select lines in order to provide a data path.

As shown in FIG. 4, the activation of the hatched blocks (i.e., the odd numbered blocks) or the white blocks (i.e., the even numbered blocks) produces the same combination of the upper and lower bits. This reduces the number of the data input/output line pairs IO, assigning a DCA to each pixel, and commonly occupying the pre-decoder of the remaining column addresses. According to the inventive block write structure, the number of the input/output lines is minimized to perform the block write function, so that the chip size is optimized compared to the memory device with no block write function. The column gate is commonly occupied by the adjacent memory cell blocks, thus resolving the junction loading problem. The effective byte masking is achieved resulting in the lay-out efficiency together with increasing designing efficiency.

The internal bit structure of the memory cell array block 2-1 is described with reference to FIG. 5. There are sequentially arranged from the top to the bottom the bits DQ8, DQ9, DQ0, DQ1, etc., the number of which is 256. The CLSi(i=0, 2, ..., 255) upper controls the IO pair of the bits DQ8, DQ9 to gate the columns of the bits of the upper byte. The CLSi(i=0, 2, ..., 255) lower controls the IO pair of the bits DQ0, DQ1 to gate the columns of the bits of the lower byte. For example, the CSL0 upper controls the output of the bits DQ0, DQ1 of the lower byte positioned in the top of FIG. 5. Similarly, the CSL0 lower controls the output of the bits DQ0, DQ1. The remaining memory cell blocks 2-2, 2-3, ..., 2-8 are similarly controlled. Of course, the bits of the lower byte may be positioned in the top.

The bit output path of the memory cell blocks is described with reference to FIG. 6. The input/output line pairs IO are provided with a plurality of multiplexer 8a, 8b, 8c, 8d so as to retrieve the bit stored in a targeted memory cell block in the half-activation. In the drawing, the odd numbered memory cell blocks 2-1, 2-3, ... are activated. The input/output pair IO between the memory cell block 2-1 and 2-2 always outputs the bits DQ8, DQ9 regardless of whether one or the other is selected. Likewise, the input/output pair IO between the memory cell block 2-3 and 2-4 always outputs DQ10, DQ11. These input/output line pairs IO do not require a separate multiplexer, and their output data directly amplified by sense amplifiers SA6. However, there are required between the memory cell block 2-2 and 2-3 and between 2-4 and 2-5 (not shown) the multiplexers as shown in FIG. 6. For example, the masking data DQ0, DQ1 may be outputted from the memory cell block 2-1 or 2-2. Activating the odd numbered memory cell blocks is to cause the input/output pair IO in the leftmost to produce the bits DQ0, DQ1, and the input/output pair IO between the memory cell block 2-2 and 2-3 to produce the bits DQ2, DQ3. On the contrary, activating the even numbered memory cell blocks is to cause the leftmost input/output pair IO to produce no bit and, the input/output pair between the memory cell block 2-2 and 2-3 to produce the bits DQ0, DQ1.

To this end, the activation of the odd numbered memory cell blocks requires the activation of the multiplexers 8a, 8c and deactivation of the multiplexers 8b, 8d. Then the bits DQ0, DQ1 of the memory cell block 2-1 are transferred to the sense amplifiers SA6 via the multiplexer 8a, and the bits DQ2, DQ3 of the memory cell block 2-3 to the sense amplifiers SA6 via the multiplexer 8c. On the other hand, the activation of the even numbered memory cell blocks requires the activation of the multiplexers 8b, 8d and deactivation of the multiplexers 8a, 8c. Then the bits DQ0, DQ1 of the memory cell block 2-2 are transferred to the sense amplifiers SA6 via the multiplexer 8b, and the bits DQ2, DQ3 of the memory cell block 2-4 to the sense amplifiers SA6 via the multiplexer 8d. Thus the output bits are obtained as shown in the bottom of FIG. 4.

Each of the multiplexers 8 employed in the present invention comprise transmission gates TG1 and TG2 as shown in FIG. 7, where the control signal RA8 is an address to select one of the memory cell blocks.

Figure 1:
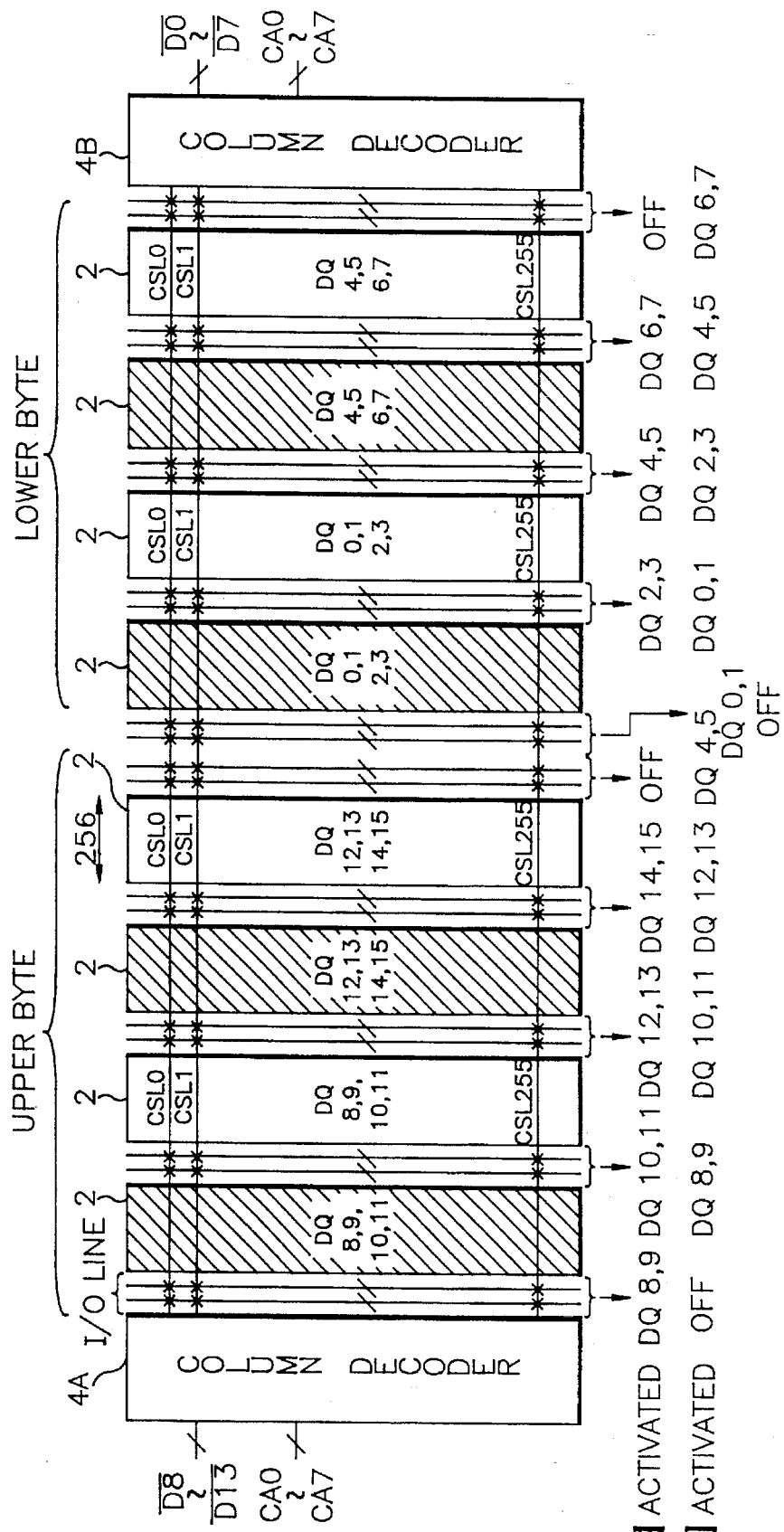
FIG. 1 illustrates the structure of decoding for performing the column gating in block write according to a conventional semiconductor memory device.
Figure 2A:
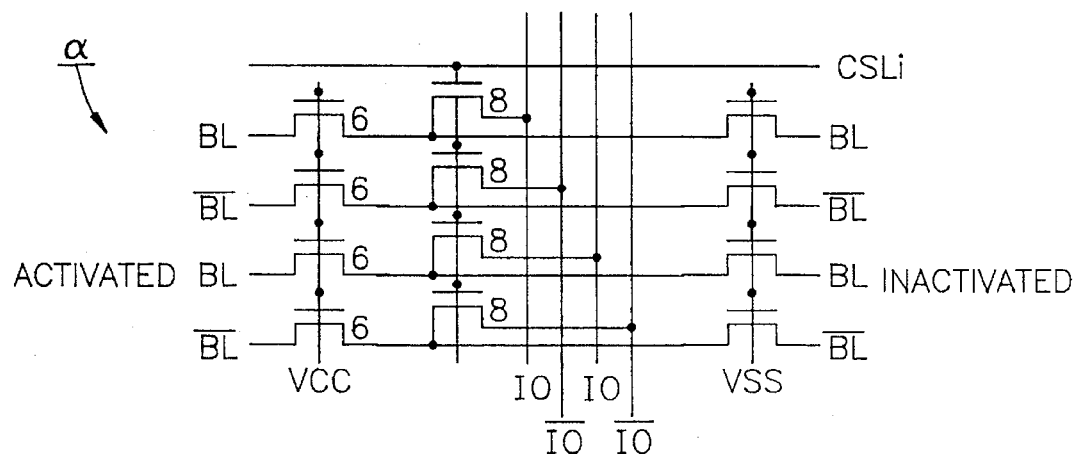
FIGS. 2A, 2B and 2C illustrate varieties of the column gating between the upper byte blocks and the lower byte blocks in the semiconductor memory device of FIG. 1.
Figure 2B:
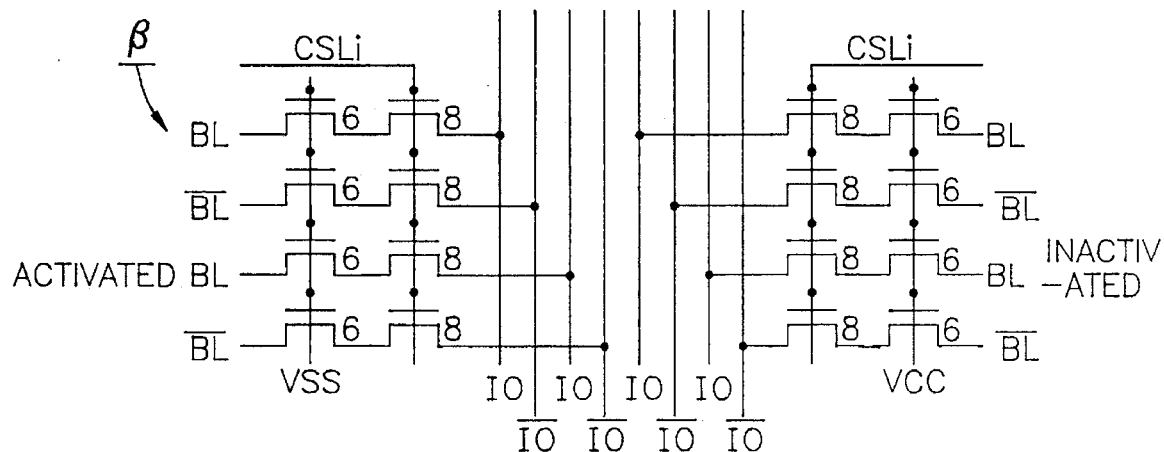
Figure 2C:
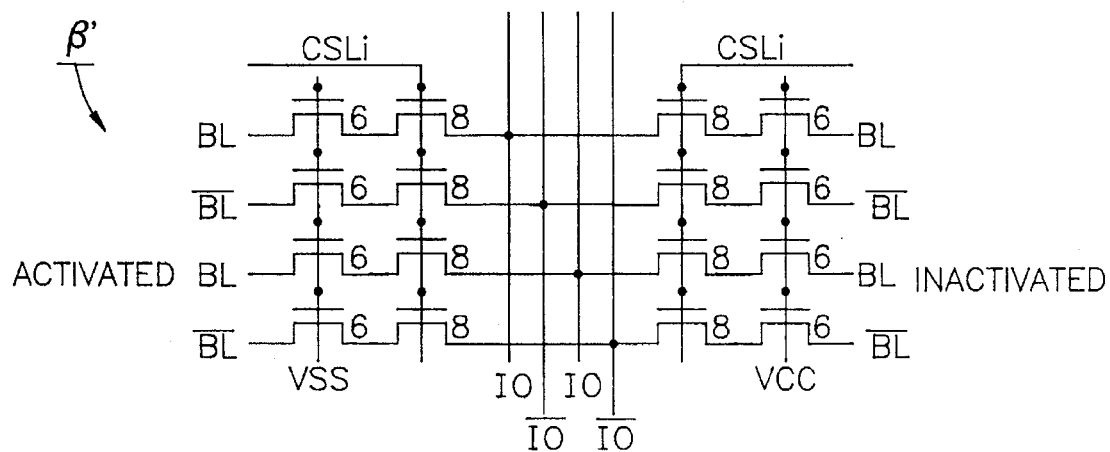
Figure 3:
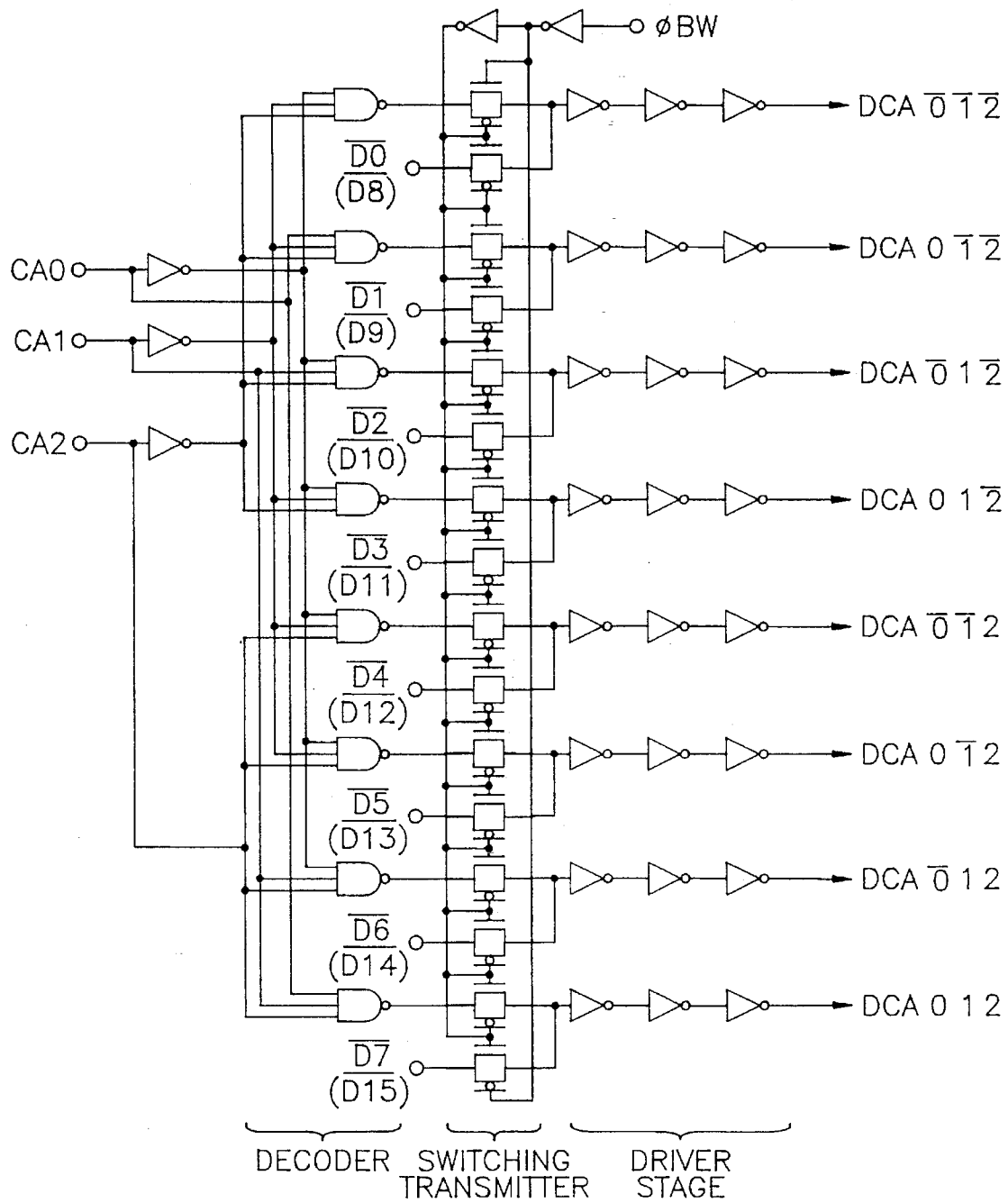
FIG. 3 is a schematic diagram for illustrating the structure of the column pre-decoder applied to FIG. 1.

The structure of the column decoder 4 of FIG. 4 is described with reference to FIG. 8. It comprises a pre-decoder and a decoder for decoding the output of the pre-decoder. The portions DCA012 are obtained by using the pre-decoder of FIG. 4. The column select lines CSL are grouped in CSLi upper and CSLi lower which are decoded and coded by CA0, ..., CA7 in normal read/write, and are differently decoded respectively by DCA0, ..., DCA7, DCA8, ..., DCA15, and CA3, ..., CA7. The CSL upper and CSL lower are arranged in parallel on the memory cell block 2-j connected with the corresponding column select line CSL of each 256K block unit. Namely, there are provided a plurality of the column select lines (two lines in the present embodiment) to not decoded in the same state at a special case such as the block write. Although the upper and lower byte each requires a separate DCA012, the decoder region from CA3 to CA7 is commonly occupied differing from FIG. 1, thereby reducing the chip size, improving the lay-out efficiency and increasing the design efficiency. The present embodiment is described with reference to the data width of ×16, but it will be apparent to those skilled in the art to apply the present invention to a memory device with the data width over ×32.

What is claimed is:

1. A semiconductor memory device with a block write function for reading and writing data having at least two bytes, comprising:
    a plurality of memory cell blocks for each associating first bits accessed in response to a first column address to designate the upper one of said two bytes and for each associating second bits accessed in response to a second column address to designate the lower one of said two bytes;
    at least two column select lines enabled in response to each of said first and second column addresses; and
    a control circuit for separately controlling said at least two column select lines, wherein the bits of said upper and lower bytes stored in said memory cell blocks are all output in response to said first and second column addresses.

2. A semiconductor memory device as defined in claim 1, wherein said control circuit comprises a first column decoder for enabling the column select lines to designate said upper byte in response to said same column addresses and a second column decoder for enabling the column select lines to designate said lower byte.

3. A semiconductor memory device with a block write function for reading and writing data having at least two bytes, comprising:
    a first memory cell block for associating first bits accessed in response to a first column address to designate the upper one of said two bytes and second bits accessed in response to a second column address to designate the lower one of said two bytes;
    a second memory cell block with the same bit structure as said first memory cell block;
    a first pair of data input/output lines formed between said first and second memory cell blocks and commonly occupied by them;
    a second pair of data input/output lines formed in the side of said first memory cell block opposite to said first pair of data input/output lines for transferring the bits of said first memory cell block;
    a third pair of data input/output lines formed in the side of said second memory cell block opposite to said first pair of data input/output lines for transferring the bits of said second memory cell block;
    a switching circuit for selectively switching said second pair of data input/output lines or said third pair of data input/output lines in response to a block select address to selectively designate said first or second memory cell block; and
    column select lines for transferring the bits of said upper and lower bytes via said first to third data input/output lines in response to said first and second column addresses.

4. A semiconductor memory device as defined in claim 3, wherein said first and second memory cell blocks are selectively activated according to a low address.

5. A semiconductor memory device as defined in claim 3, wherein said switching circuit comprises multiplexers formed between said second and third pairs of data input/output lines for inputting said block select address to gates.

6. In a semiconductor memory device with a block write function for reading and writing data having at least two bytes, which comprises a plurality of memory cell blocks for each associating first bits accessed in response to a first column address to designate the upper one of said two bytes and for each associating second bits accessed in response to a second column address to designate the lower one of said two bytes, at least two column select lines enabled in response to said first and second column addresses, and a control circuit for separately controlling said at least two column select lines, a method for gating the columns of semiconductor memory device characterized in that the bits of said upper and lower bytes are simultaneously gated in response to said first and second column addresses.

7. A method as defined in claim 6, wherein said control circuit comprises a first column decoder for enabling the column select lines to designate said upper byte in response to said same column addresses and a second column decoder for enabling the column select lines to designate said lower byte.

8. In a semiconductor memory device with a block write function for reading and writing date having at least two bytes, which comprises a first memory cell block for associating first bits accessed in response to a first column address to designate the upper one of said two bytes and second bits accessed in response to a second column address to designate the lower one of said two bytes, a second memory cell block with the same bit structure as said first memory cell block, a first pair of data input/output lines formed between said first and second memory cell blocks and commonly occupied by them, a second pair of data input/output lines formed in the side of said first memory cell block opposite to said first pair of data input/output lines for transferring the bits of said first memory cell block, a third pair of data input/output lines formed in the side of said second memory cell block opposite to said first pair of data input/output lines for transferring the bits of said second memory cell block, a switching circuit for selectively switching said second pair of data input/output lines or said third pair of data input/output lines in response to a block select address to selectively designate said first or second memory cell block, and column select lines for transferring the bits of said upper and lower bytes via said first to third data input/output lines in response to said first and second column addresses, a method for gating the columns of said semiconductor device characterized in that the bits of said upper and lower bytes are respectively gated via said second and third pairs of data input/output lines while activating said first memory cell block.

9. A method as defined in claim 8, wherein said first and second memory cell blocks are selectively activated according to a low address.

10. A method as defined in claim 8, wherein said switching circuit comprises multiplexers formed between said second and third pairs of data input/output lines for inputting said block select address to gates.

11. In a semiconductor memory device with a block write function for reading and writing data having at least two bytes, which comprises a memory cell array with a plurality of memory cell blocks each for associating bits accessed in response to a first column address to designate the upper one of said two bytes and bits accessed in response to a second column address to designate the lower one of said two bytes, a first column select line formed on said memory cell array in a given direction for gating the bits of said upper byte in response to a combined input signal, a second column select line formed in the same direction as said first column select line for gating the bits of said lower byte in response to said combined input signal, a first column decoder for enabling said first column select line, a second column decoder for enabling said second column select line, a first column pre-decoder for inputting a first masking data to mask the bits of said lower byte and said combined input signal, and a second column pre-decoder for inputting a second masking data to mask the bits of said upper byte and said combined input signal, a method for gating the columns of said semiconductor memory device characterized in that the bits of said upper and lower bytes are simultaneously gated in response to said first and second column addresses, and the masking of the columns is performed during block writing.

* * * * *